United States Patent [19]

Teshima et al.

[11] Patent Number: 4,482,611

[45] Date of Patent: Nov. 13, 1984

[54] ELECTRONIC PARTS

[75] Inventors: Koichi Teshima; Masakazu Yamada, both of Tokyo; Toshiharu Sakurai, Yokohama; Takemi Abe, Fujisawa, all of Japan

[73] Assignee: Tokyo Shibaura Denki Kabushiki Kaisha, Kawasaki, Japan

[21] Appl. No.: 451,461

[22] Filed: Dec. 20, 1982

[30] Foreign Application Priority Data

Dec. 23, 1981 [JP] Japan .................. 56-207190

[51] Int. Cl.$^3$ .......................... C23C 1/04; B32B 15/01
[52] U.S. Cl. .................................................. 428/647
[58] Field of Search ................. 428/643, 647, 674; 420/490

[56] References Cited

U.S. PATENT DOCUMENTS 2,741,019 4/1956 Faust .................................. 428/644
4,279,967 7/1981 Sawada ............................. 428/644

FOREIGN PATENT DOCUMENTS 2730625 1/1979 Fed. Rep. of Germany ...... 428/647
53-42390 11/1978 Japan .
54-23031 2/1979 Japan ................................. 428/644
56-20135 2/1981 Japan ................................. 420/490

Primary Examiner—L. Dewayne Rutledge
Assistant Examiner—Robert L. McDowell
Attorney, Agent, or Firm—Schwartz, Jeffery, Schwaab, Mack, Blumenthal & Koch

[57] ABSTRACT

An electronic part composed of an alloy comprising, as a basic metal or metals, Cr and Zr with the total amount thereof being between 0.3 and 2.0% by weight (provided that the amount of Cr is 1.5% by weight or less and that of Zr is 1.0% by weight or less) and Cu as a balance, the surface of said part having been coated with Sn.

The electronic part according to the present invention is excellent in the wetting property of a solder, weather resistance of a solder and bonding property to Au and Al.

7 Claims, 4 Drawing Figures

ELECTRONIC PARTS

BACKGROUND OF THE INVENTION

The present invention relates to improved miniature electronic parts, i.e. improved lead terminals suitable for semiconductor devices such as integrated circuits, diodes and transistors.

In recent years, it has been required of a semiconductor device to increase its output and to expand its functions, and a variety of research has been made for fulfilling such requirements. Moreover, there has been an extremely severe requirement to provide a device by which improvements in productivity and thus reduction in costs are possible, in addition to sufficient satisfaction of the above-mentioned requirements.

As a structure of a semiconductor device which can keep up the above-mentioned properties to an enough extent and which can be mass produced, a package type obtained by the use of a resin mold is considered to be most promising, and also in preparing such a type of semiconductor device, various processes such as mounting, bonding and plating are utilized.

A lead frame is one of material parts used under severe conditions. For practical use, the lead frame is required to maintain various properties, i.e., electric resistance and surface oxidizability being low; tensile strength being sufficient; ductility being excellent, because of many bending manipulation being carried out; high-temperature property being good, for example, enough mechanical strength mentioned above being maintained even at 250° C. or more; wetting property to a solder being good; change in properties with time and deterioration in weather resistance of a solder being small; and the like.

Now, as a material suitable for the lead frame, there can be taken up copper (Cu) which is high in conductivity, however, is insufficient in high-temperature property and strength. Accordingly, Cu is used together with other elements. In this case, there are problems in the following points. Namely, when Sn and Fe are added as additives to the Cu and the resultant lead frame is soldered, the added elements will diffuse in a used solder, which fact will bring about deterioration in weather resistance of the lead frame. For the purpose of preventing such a deterioration in the weather resistance, Ni plating and Sn plating have been applied in the form of two layers to the surface of the above-described lead frame which is made of an alloy including the Cu.

This necessity of the two plating processes disadvantageously leads to increase in the number of processes and consequently in the cost of the lead frame. Therefore, it is preferable for cost reduction to omit an Ni plating process, if possible.

The present inventors of the present invention have addressed this problem and consequently have been able to accomplish the invention disclosed in Japanese Patent Publication No. 42390/1978. A product obtained according to this disclosed invention in which each small amount of Cr, Zr and Si is added to Cu can satisfy most of the requirements of the characteristics mentioned above. In the case of the disclosed invention, however, since addition of each metallic element is limited to a small amount (0.01 to 0.3% by weight), problems are liable to occur in that the product does not always have sufficient strength, and moreover it is difficult to control such a minor amount. Accordingly, for the solution of these problems, the present inventors have further conducted research, for example, on how to obtain a device capable of sufficiently fulfilling the above-mentioned requirements by adding Cr alone to Cu, and in the case that Cr and Zr are added to Cu, and in the case that other elements are added.

For example, when Cr, Zr, Ni, Fe and Sn are merely added to Cu, the resultant products cannot satisfy all requirements of characteristics such as oxidizability, conductivity, change in properties with time, wetting property to a solder, weather resistance of a solder, hardness, roughness of appearance and high-temperature property.

The reason why such products just described are so poor in characteristics as not to be used practically is that additives such as Ni, Fe, Sn and the like which are added to the Cu for the improvement of strength are undesirably deposited out or concentrated on the surface of each product and these additives bring about problems such as deterioration with time in weather resistance of a solder, reduction in conductivity and degradation in appearance of a used solder.

SUMMARY OF THE INVENTION

The present inventors have completed the present invention by selecting a basic metal and a coating metal with which the basic metal is coated in accordance with a conventional technique which has been practically employed.

It has been found that certain element can be added to Cu which is the main component of the basic metal, in a considerably larger amounts compared with that in a conventional technique, when a coating is applied to the basic metal as mentioned above. In this case, however, it must be avoided that two coating layers are formed on the basic metal as in a conventional way.

These matters are coincident with the basic conceptions of the present invention that a coating layer is limited to a minimum and the amounts of elements added to the basic metal are maximized by utilizing said coating layer.

As the elements to be added, chromium (Cr) and zirconium (Zr) have been selected. These elements are materials which are suitable for accomplishing the object of the present invention by use in small amounts. Further, as a material with which the basic metal is coated, tin (Sn) has been employed in order to suit a Sn-Pb type solder.

According to the present invention, there has been provided an electronic part composed of an alloy comprising, as a basic metal or metals, Cr and Zr with the total amount thereof being between 0.3 and 2.0% by weight (provided that the amount of Cr is 1.5% by weight or less and that of Zr is 1.0% by weight or less) and Cu as a balance, the surface of said part having been coated with Sn.

BRIEF DESCRIPTION OF THE DRAWINGS

In order to illustrate the present invention in more detail, hereto attached are drawings in which.

DETAILED DESCRIPTION OF PREFERRED EMBODIMENTS

At least one of Cr and Zr can be added to Cu mentioned above. A combination of the Cr and Zr is added in an amount between 0.3 and 2% by weight, but the amount of the Cr must not be more than 1.5%. It is important that the amount of the Zr is not more than 1.0%, preferably in the range of 0.05 to 0.5% by weight. Further, as a coating material, Sn may be employed by means of plating or the like. This coating is preferably greater than 2 $\mu$m, preferably in the range of 3 to 20 $\mu$m in thickness and, unless its thickness is in excess of the value, it will be impossible to play roles as a coating layer.

Figure 1:
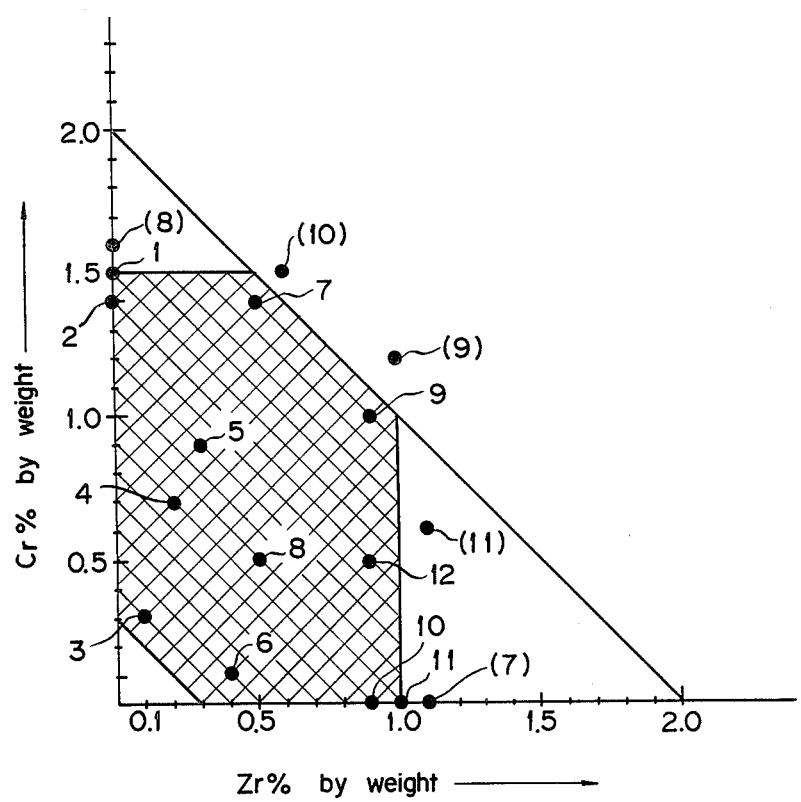
FIG. 1 is an illustrative view explaining a composition range of electronic parts according to the present invention.

The amount of the Cr to be added is limited to a range between about 0.3 and 1.5% by weight as shown in FIG. 1. The reason why the upper limit of this range is set to 1.5% by weight is that the Cr is easy to deposit out in view of its relation with the Sn coating layer. When the content of the Cr is high, the obtained product will have sufficient strength, but its conductivity will be poor. However, the latter disadvantage is not so great as to adversely affect finished electronic parts, therefore an extremely high reliability obtained from the improvement of strength should predominantly be considered and utilized. On the contrary, if the amount of the Cr is less than about 0.3% by weight when the Cr alone is added to the Cu, obtained parts will be insufficient in strength, in cases where these parts are used under severe conditions, i.e., when manufactured at a high temperature of not less than 400° C. or used by being subjected to frequent bending, and the yield of the parts will be as low as 30% or less, resulting in less reliability.

Considering each factors such as mechanical strength, formation of intermetallic compounds between the Cr metal and the Sn coating, conductivity and the like, the amount of the Cr is particularly preferably within a range between 0.5 and 1.0% by weight.

Further, it is also important to add Zr in an amount within a range between 0.3 and 1.0% by weight, as shown in FIG. 1, for the same reason as referred to the Cr.

When the Cr and Zr are mixed and added to the Cu, the amount of the mixture can be increased to a range between 0.3 and 2.0% by weight, which amount is larger than in the case that the Cr or Zr is used alone. Therefore, the employment of the Cr and Zr is convenient for the manufacture of harder lead frames.

It has been found that when amounts of the Zr, the Cr, and the combination of the Cr and Zr are 1.2%, 1.6% and 2.4% (1.2% of the Cr and 1.2% of the Zr) respectively, which are all in excess of the above ranges, local depositions of the used metals will get greater due to the employment of a dissolving process, so that an aimed object of the present case will not be achieved, as shown in Table 1.

The coating layer mentioned above is porous, therefore when being too thin, the layer allows oxygen to penetrate through pores thereof to oxidize the interface between the basic metal and the coating layer. In consequence, the wetting property to a solder will be impaired, with the result that obtained products can not be used practically. This is the reason why the thickness of the coating layer should be regulated to 2 $\mu$m or more.

The present inventors have researched on Sn, which is one component of a solder, and Fe as additives in addition to the Cr and/or Zr, but these metals have not been able to provide any successful results. It has also been confirmed that the employment of the Sn or Fe as an additive causes practically many undesirable problems such as poor hardness and unstable jointing strength, as indicated in Comparative Examples 1 to 6 of Table 1. Further, experiments have confirmed that a lead frame manufactured by plating the Cu-including basic metal with the Sn does not reduce in weather resistance of a solder thereon even after used.

Figure 2:
FIG. 2 is a cross-sectional view of an IC in which one exemplary lead frame according to the present invention is used.
Figure 3:
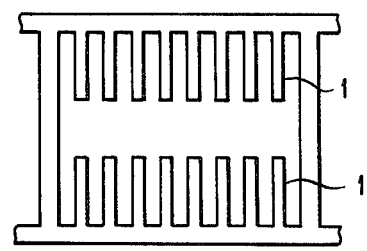
FIG. 3 is a front elevational view of the lead frame shown in FIG. 2.

That is to say, an ingot was prepared by adding at least one of the Cr and Zr to the Cu and dissolving them, and was subjected to a hot rolling (600° to 900° C.) to be molded into a blank of about 0.5 mm in thickness and about 30 mm in width, followed by a predetermined heat treatment to produce a Cr or Zr depositing hard-type copper alloy basic metal. Next, the resultant basic metal was subjected to a press work to provide a shape so as to be suitable for a lead frame for IC. The resultant metal was heated at 350° C. for a period of about 10 seconds, degreased, pickled, coated by plating with the Sn up to a thickness of about 6 $\mu$m, and shaped into a lead frame (1) for IC as shown in FIG. 2 or 3.

A heat test a result of which is one factor for evaluating the obtained lead frame for IC was carried out as follows: The lead frame was allowed to stand at a maintained temperature within a range of about 100° to 150° C. in the atmosphere for a period of 300 hours, dipped (for about five seconds) in a Pb-Sn solder solution (at about 260° C.), and subjected to a joining strength test and a bending test. Results of this heat test indicated that the lead frame according to the present invention scarcely brought about any peeling phenomenon. Further, according to another test comprising a reverse procedure to the above heat test, i.e. the procedure in which the lead frame is dipped (for about 5 seconds) in the Pb-Sn solder solution (at about 260° C.) to joint the solder thereon and then heated at a temperature of 100° to 150° C. in the atmosphere, it has been confirmed that change in quality of the product was scarcely observed.

Figure 4:
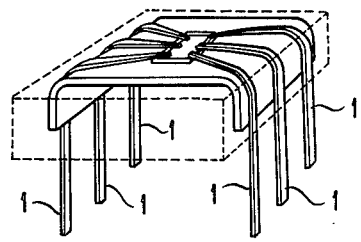
FIG. 4 is a perspective view of a semiconductor device in which another exemplary lead frame according to the present invention is used.

The lead frames according to the present invention may be prepared by cutting one prolonged plate, as shown FIG. 4. Each lead frame is prepared into a plate-like shape having a thickness of about 0.4 mm and a width of about 2 mm. The product can be wound up in a spool-like form for storage. Further, the lead frame according to the present invention may take a linear form having a diameter of, for example, 0.45 mm.

As described above, the lead frame according to the present invention may take any shape and is highly useful not only as a lead frame for an integrated circuit but also as a lead terminal (usable also as a part of an electrode) for each of electronic parts such as a diode, a transistor, a thyristor and the like. The lead materials for electronic parts manufactured by adding at least one of Cr and Zr in a limited amount to Cu as a main component in the basic metal and by synergistically performing a minimal plating (Sn) are low in electric resistance, and excellent in tensile strength, bending work character, high-temperature property, prevention of deterioration in weather resistance of a solder and the like. Therefore, they are noticeably reliable and practical and can achieve the desired object of the present invention. Moreover, since one plating process of the Sn is enough for completion of the product, the manufacturing steps are not so complicated, and the product can also be obtained at low costs.

TABLE 1

| | Main component | Additive (% by weight) | Coating layer | Oxidization | Appearance | Hardness (not less than HV 100) | Joining strength | Weather-resistance | Total evaluation |
|---|---|---|---|---|---|---|---|---|---|
| Comparative Example (1) | Cu | Sn 0.2 | Sn 6μ | | Good | Bad | Good | | x |
| (2) | " | Sn 1.0 | " | | " | Good | Bad | | x |
| (3) | " | Sn 5.5 | " | | " | " | " | | x |
| (4) | " | Fe 0.1 | " | | " | Bad | Good | | x |
| (5) | " | Fe 1.5 | " | | " | Good | Bad | | x |
| (6) | " | Fe 2.4 | " | | " | " | " | | x |
| Example 1 | Cu | Cr 1.5 | Sn 6μ | None | Good | Good | Good | Good | O |
| 2 | " | Cr 1.4 | " | " | " | " | " | " | O |
| 3 | " | Cr 0.3 + Zr 0.1 | " | " | " | " | " | " | O |
| 4 | " | Cr 0.7 + Zr 0.2 | " | " | " | " | " | " | O |
| 5 | " | Cr 0.9 + Zr 0.3 | " | " | " | " | " | " | O |
| 6 | " | Cr 0.1 + Zr 0.4 | " | " | " | " | " | " | O |
| 7 | " | Cr 1.4 + Zr 0.5 | " | " | " | " | " | " | O |
| Example 8 | " | Cr 0.5 + Zr 0.5 | Sn 6 μ | None | Good | Good | Good | Good | O |
| 9 | " | Cr 1.0 + Zr 0.9 | " | " | " | " | " | " | O |
| 10 | " | Zr 0.9 | " | " | " | " | " | " | O |
| 11 | " | Zr 1.0 | " | " | " | " | " | " | O |
| 12 | " | Cr 0.5 + Zr 0.9 | Sn 4μ | " | " | " | " | " | O |
| Comparative Example (7) | Cu | Zr 1.1 | Sn 6μ | Slightly present | Good | Good | Good | Good | x |
| (8) | " | Cr 1.6 | " | Slightly present | " | " | " | " | x |
| (9) | " | Cr 1.2 + Zr 1.0 | " | Slightly present | " | " | " | " | x |
| (10) | " | Cr 1.5 + Zr 0.6 | " | Slightly present | " | " | " | " | x |
| (11) | " | Cr 0.6 + Zr 1.1 | " | Slightly present | " | " | " | " | x |

The present invention will be described by way of Examples as follows: To a 99.9% pure copper an about 1.5% by weight of chromium was added, and these metals were dissolved to produce an ingot of a Cu-Cr alloy. After forging, the ingot was subjected to annealing at 750° C. for a period of about one hour, followed by cold rolling to form a lead frame blank for IC of about 500 mm in length, about 30 mm in width and about 0.25 mm in thickness. The formed blank was punched out into a desired shape by means of a press or the like, in turn degreased, pickled, and plate with Sn to such a degree that a plating layer reached about 6 μm in thickness, in order to complete a lead frame.

The evaluation of the thus obtained lead frame is exhibited on the column of Example 1 in Table 1. That is to say, the lead frame is provided with sufficient strength and also presented extremely good results in points of oxidizability, joining strength and weather resistance, but a surface thereof was roughened. This roughing phenomenon, however, is so minor as to be plactically neglected. Example 2 was carried out in the same manner as in Example 1 with the exception that the amount of the Cr was somewhat smaller. The product obtained therein did not exhibit such a surface roughing phenomenon as appeared in Example 1. Therefore, the lead frame prepared in Example 2 is excellent in the appearance and is suitable for a lead terminal for diode and the like in which the part of lead terminal is directly used as an electrode.

Examples 3 to 9 were carried out in the same manner as in the preceding Examples with the exception that the three-component metallic bases in which the Cr and Zr were added to the Cu were used. The products obtained in Examples 3 to 9 were characterized by being particularly excellent in strength and weather resistance. In Examples 10 and 11, Zr was used alone as an additive, and it was verified that the products obtained in these Examples could accomplish the desired object, though minute roughing phenomena were observed on the surfaces thereof.

The lead frames according to the present invention have hereinbefore been described as members for semiconductors, but they can be employed as similar general electronic and electric parts (for example, as a lead wire for an electronic tube and a lead wire for an electric bulb).

We claim:
1. An electronic part comprising:
(i) a high strength Cr and Zr deposition type copper alloy consisting essentially of Cu, Cr in an amount more than 0.3% and less than 1.5% by weight, and Zr in an amount of about 1% by weight or less, the total amount of Cr and Zr being between about 0.3% and about 2.0% by weight, said copper alloy being the product of a process comprising the steps of
(a) dissolving in substantially pure Cu at least one of Cr, in an amount more than 0.3% and less than about 1.5% by weight, or Zr, in an amount of about 1% by weight or less, the total amount of Cr and Zr being between about 0.3% and about 2.0% by weight,
(b) preparing a workpiece from the solution prepared in step (a),
(c) hot rolling said workpiece at a temperature between about 600° and about 900° C.,
(d) annealing said workpiece after hot rolling, and
(e) shaping said workpiece after step (d) to form said electronic part; and
(ii) a coating on said high strength copper alloy, said coating comprising Sn.

2. An electronic part according to claim 1, wherein the amount of Cr is in the range of from 0.5 to 1.0% by weight.

3. An electronic part according to claim 1, wherein the amount of Zr is in the range of from 0.05 to 0.5% by weight.

4. An electronic part according to claim 1, wherein the thickness of the coating is not less than 2 microns.

5. An electronic part according to claim 4, wherein the thickness of the coating is in the range of from 3 to 20 microns.

6. An electronic part according to claim 1, wherein said electronic part is a lead frame.

7. An electronic part according to claim 1, wherein said annealing is at about 750° C. for a period of approximately one hour.

* * * * *